US008785853B2

(12) United States Patent
Yamazaki et al.

(10) Patent No.: US 8,785,853 B2
(45) Date of Patent: Jul. 22, 2014

(54) INFRARED SENSOR PACKAGE AND ELECTRONIC DEVICE EQUIPPED THEREWITH

(75) Inventors: Takao Yamazaki, Tokyo (JP); Koji Kato, Tokyo (JP); Tokuhito Sasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 56 days.

(21) Appl. No.: 13/311,678

(22) Filed: Dec. 6, 2011

(65) Prior Publication Data

US 2012/0138803 A1 Jun. 7, 2012

(30) Foreign Application Priority Data

Dec. 6, 2010 (JP) ................................. 2010/271412

(51) Int. Cl.
*G01J 5/04* (2006.01)

(52) U.S. Cl.
USPC ...................................................... 250/338.1

(58) Field of Classification Search
USPC ...................................................... 250/338.1
See application file for complete search history.

(56) References Cited

U.S. PATENT DOCUMENTS

| 5,041,723 | A | * | 8/1991 | Ishida et al. | 250/339.01 |
| 5,763,885 | A | * | 6/1998 | Murphy et al. | 250/352 |
| 5,914,488 | A | * | 6/1999 | Sone | 250/338.1 |
| 6,844,606 | B2 | * | 1/2005 | Logsdon et al. | 257/434 |
| 7,208,736 | B2 | * | 4/2007 | Watanabe | 250/338.1 |
| 8,158,946 | B2 | * | 4/2012 | Wong | 250/343 |
| 2002/0043672 | A1 | * | 4/2002 | Toyoda | 257/225 |
| 2006/0060785 | A1 | * | 3/2006 | Tinnes | 250/338.1 |
| 2006/0249835 | A1 | * | 11/2006 | Miyauchi | 257/706 |
| 2009/0140149 | A1 | * | 6/2009 | Tinnes | 250/352 |
| 2011/0243162 | A1 | * | 10/2011 | Fujii et al. | 372/21 |

FOREIGN PATENT DOCUMENTS

| JP | 4-137676 A | 5/1992 |
| JP | 6-137940 A | 5/1994 |
| JP | 7-508384 A | 9/1995 |
| JP | 11-142245 A | 5/1999 |
| JP | 2000-502449 A | 2/2000 |
| JP | 2000-266596 A | 9/2000 |
| JP | 2002-195885 A | 7/2002 |
| JP | 2006081204 A | 3/2006 |
| JP | 2006-88088 A | 4/2006 |
| JP | 2009-74944 A | 4/2009 |
| JP | 2010-175303 A | 8/2010 |
| WO | WO 2010074074 A1 * | 7/2010 |

OTHER PUBLICATIONS

Japanese Office Action for JP2010-271412 mailed on Mar. 5, 2013 with English Translation.
Japanese Office Action for JP Application No. 2010-271412 mailed on Sep. 3, 2013 with English Translation.

* cited by examiner

*Primary Examiner* — Christine Sung
(74) *Attorney, Agent, or Firm* — Sughrue Mion, PLLC

(57) ABSTRACT

An infrared sensor package includes a housing member, which includes an upper-surface section provided with a transmission member which transmits infrared radiation and a lower-surface section and whose inner space is vacuum-sealed, a plate-like heater member which is disposed within the inner space of the housing member and generates heat, an infrared detection element which is fixed onto the heater member and detects the infrared radiation which is transmitted by the transmission member, and a heat-insulating member which has a low thermal conductivity and a smaller cross-sectional area than that of the heater member, and supports the heater member while being fixed onto the lower-surface section.

6 Claims, 4 Drawing Sheets

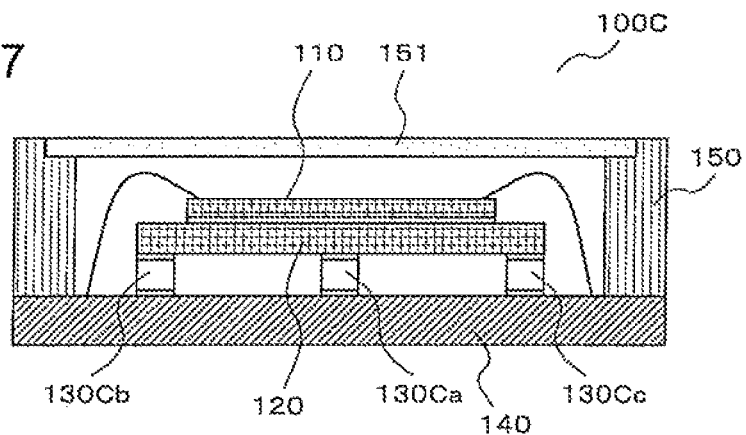
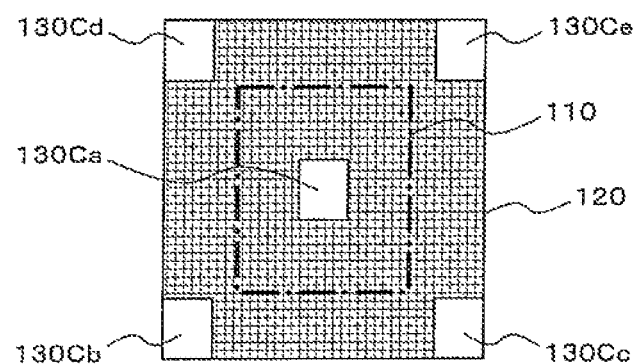
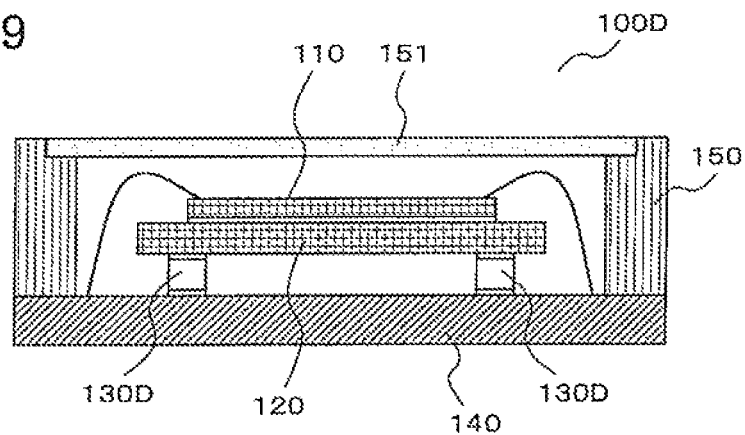

-- PRIOR ART --

INFRARED SENSOR PACKAGE AND ELECTRONIC DEVICE EQUIPPED THEREWITH

INCORPORATION BY REFERENCE

This application is based upon and claims the benefit of priority from Japanese Patent Application No. JP 2010-271412, filed on Dec. 6, 2010, the disclosure of which is incorporated herein in its entirety by reference.

BACKGROUND OF THE INVENTION

1. Technical Field

The present invention relates to an infrared sensor package which detects infrared radiation using by an infrared detection element which is vacuum-sealed within the package.

2. Background Art

In recent years, on a package in which an infrared sensor is vacuum-sealed or an electronic apparatus equipped with the package, there are demands for miniaturization, performance improvement and cost reduction. Quantum-type and thermal-type infrared sensors are mentioned as general infrared sensors. The thermal-type one uses a method of detecting relative amount of heat, so it can be operated in an uncooled system and be simple in structure. Accordingly, the thermal-type one can be produced at lower cost than the quantum-type one, while the former is inferior to the latter in tracking performance.

A thermal-type infrared sensor package is disclosed, for example, in Patent document 1 (Japanese Patent Application Laid-Open No. H06-137940), Patent document 2 (Japanese Patent Publication No. H07-508384) and Patent document 3 (Japanese Patent Application Laid-Open No. 2006-081204). A cross-section structure of an infrared sensor of Patent document 1 is shown in FIG. 12. In an infrared sensor package 900 of Patent document 1 shown in FIG. 12, a substrate 920 in which a hollow space portion is formed is disposed on a base plate 910. There are laminated a heat-insulating film 930, heating element 940 and infrared detection element 950 on the substrate 920. Further, a cap 960 including a filter window 961 is disposed above the infrared detection element 950. The infrared sensor package 900 is formed by forming space which is maintained at reduced pressure using the cap 960 and base plate 910.

Thus disposing an infrared detection element 950 within the space maintained at reduced pressure, it is possible to reduce the amount of heat escaping through the air from the infrared detection element 950, and thus to improve the sensitivity of the infrared sensor package 900.

Further, in the infrared sensor package 900 of Patent document 1, the heating element 940 and the base plate 910 are thermally separated from each other by the formation of a hollow space portion underneath the infrared detection element 950 on the substrate 920, and the heat-insulating film 930 is disposed between the heating element 940 and the substrate 920. In this way, outflow of the heat to the substrate 920 is suppressed.

On the other hand, Patent document 2 discloses an infrared sensor package provided with a Pelletier element which is used as a thermoelectric temperature stabilizer in order to keep the temperature of the infrared sensor element constant.

SUMMARY

The objective of the present invention is to provide a power-saving-type infrared sensor package wherein the infrared detection section can be maintained stably at a constant temperature even without using a Pelletier element, and to provide also an electronic apparatus equipped with the infrared sensor package.

An infrared sensor package according to an exemplary aspect of the invention includes a housing member including an upper-surface section provided with a transmission member which transmits infrared radiation, and also including a lower-surface section, wherein the inner space of the housing member is vacuum-sealed, a plate-like heater member which is disposed within the inner space of the housing member and generates heat, an infrared detection element which is fixed onto the heater member and detects the infrared radiation which is transmitted by the transmission member and a heat-insulating member which has a low thermal conductivity and a smaller cross-sectional area than that of the heater member, and supports the heater member while being fixed onto the lower-surface section.

An electronic apparatus according to an exemplary aspect of the invention is equipped with above-mentioned infrared sensor package.

BRIEF DESCRIPTION OF THE DRAWINGS

Exemplary features and advantages of the present invention will become apparent from the following detailed description when taken with the accompanying drawings in which:

FIG. 7 is an example of a cross-sectional view of an infrared sensor package 100C according to the third exemplary embodiment of the present invention;

FIG. 8 is a plan view showing an example of an arrangement state of respective members of an infrared sensor package 100C according to the third exemplary embodiment of the present invention;

FIG. 9 is an example of a cross-sectional view of an infrared sensor package 100D according to a modified embodiment of the third exemplary embodiment of the present invention;

EXEMPLARY EMBODIMENT

Exemplary embodiments of the present invention will now be described in detail in accordance with the accompanying drawings.

First Exemplary Embodiment

Figure 1:
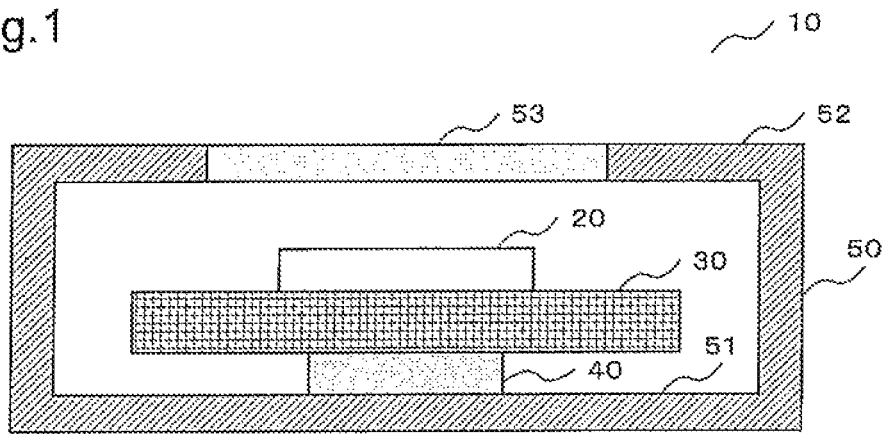
FIG. 1 is an example of a cross-sectional view of an infrared sensor package 10 according to the first exemplary embodiment of the present invention.

The first exemplary embodiment will be described below. FIG. 1 shows an example of a cross-sectional view of an infrared sensor package according to the present exemplary embodiment. In FIG. 1, an infrared sensor package 10 includes an infrared detection element 20, heater member 30, heat-insulating member 40 and housing member 50.

The infrared detection element 20 is fixed on the top surface of the heater member 30, and detects infrared radiation. The heater member 30 is a plate-like member capable of stably holding the infrared detection element 20, and generates heat so as to keep the infrared detection element 20 at a constant temperature. A common plate-like heater on the market can be applied as the heater member 30.

The heat-insulating member 40 is a member having low thermal conductivity and a smaller cross-sectional area than that of the heater member 30. In the present exemplary embodiment, a glass member is applied as the heat-insulating member 40. In order for it to support the heater member 30, the heat-insulating member 40 is formed to have a certain amount of thickness.

The heat-insulating member 40 is formed to have a certain amount of thickness using a member having low thermal conductivity, so it can sufficiently suppress the outflow of heat from the heater member 30 to the housing member 50. In addition, because the heat-insulating member 40 has a smaller cross-sectional area than that of the heater member 30, a hollow space region is formed between the heater member 30 and the housing member 50, and accordingly the heater member 30 and the housing member 50 can be thermally separated from each other. As a result, the heater member 30 can heat the infrared detection element 20 with high efficiency.

The housing member 50 is a container which is maintained in a vacuum inside. In this housing member 50, the infrared detection element 20, heater member 30 and heat-insulating member 40 are disposed on a lower-surface section 51. The infrared detection element 20 is vacuum-sealed, so it is possible to reduce the amount of heat escaping through the air, and accordingly to increase the sensitivity of the infrared sensor package 10. Further, a transmission member 53 transmitting infrared radiation is disposed at the position, in a upper-surface section 52 of the housing member 50, facing the infrared detection element 20. The infrared detection element 20 detects the infrared radiation which is transmitted by the transmission member 53.

As described above, in the infrared sensor package 10 according to the present exemplary embodiment, the heater member 30 is supported by the heat-insulating member 40 having low thermal conductivity and a smaller cross-sectional area than that of the heater member 30. In this case, it is possible to sufficiently suppress the outflow of heat from the heater member 30 to the housing member 50, and also to thermally separate the heater member 30 and the housing member 50 from each other. The infrared sensor package 10 according to the present exemplary embodiment is a power-saving-type infrared sensor package, wherein the heater member 30 can heat the infrared detection element 20 with high efficiency, and accordingly the infrared detection element 20 can be kept stably at a constant temperature.

Second Exemplary Embodiment

Figure 2:
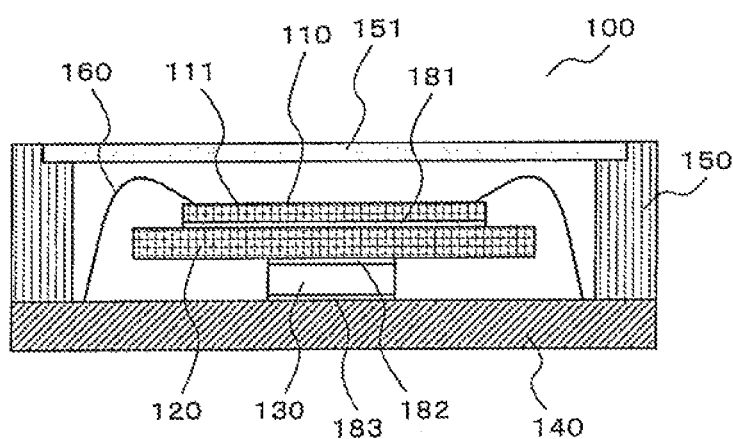
FIG. 2 is an example of a cross-sectional view of an infrared sensor package 100 according to the second exemplary embodiment of the present invention.

The second exemplary embodiment will be described. FIG. 2 shows an example of a cross-sectional view of an infrared sensor package according to the present exemplary embodiment. In FIG. 2, an infrared sensor package 100 includes an infrared detection element 110, heater 120 and heat-insulating member 130, and also includes a base 140 and a housing 150 encapsulating the infrared detection element 110 in cooperation with each other, and further includes wire leads 160. As shown in FIG. 2, the infrared detection element 110 and the heater 120 are adhesively-fixed to each other with an adhesive 181, and the heater 120 and the heat-insulating member 130 are with an adhesive 182, and the heat-insulating member 130 and the base 140 are with an adhesive 183, respectively.

The infrared detection element 110 is vacuum-sealed within a space formed by the base 140 and housing 150, and detects infrared radiation. The infrared detection element 110 is vacuum-sealed, so it is possible to reduce the amount of heat escaping through the air, and accordingly to increase the sensitivity of the infrared sensor package 100. The infrared detection element 110 is provided with a sensor unit 111 for detecting infrared radiation, and is adhesively-fixed onto the heater 120 in such a way that the sensor unit 111 faces an infrared transmission filter 151 disposed in the housing 150, which will be described later. Terminals which are not shown in the figure are disposed on the sensor unit 111 of the infrared detection element 110, and are electrically connected with the base 140 via the wire leads 160 made of a conductor. Here, as a material for the wire lead 160, it is preferable to use the materials of high electrical conductivity such as Al, Al-alloy and Au. Further, the electrical connection between the base 140 and the terminals of the infrared detection element 110 can be made also by the use of TAB (Tape Automatic Bonding) technology.

Figure 3:
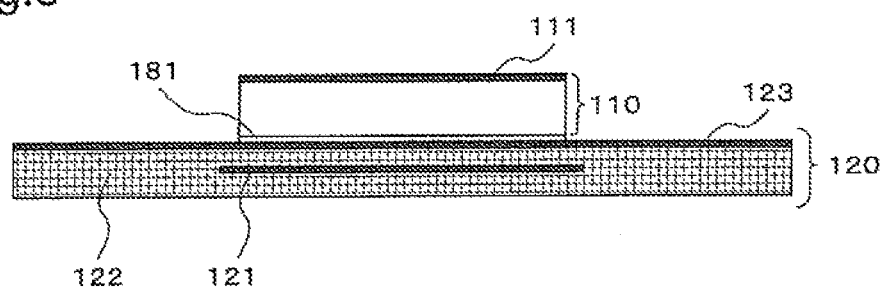
FIG. 3 is a cross-sectional view showing an example of positional relation between a heater 120 and an infrared detection element 110, in an infrared sensor package 100 according to the second exemplary embodiment of the present invention.

The heater 120 is a heater in which a heating element is disposed inside an insulating layer, and a common plate-like heater on the market can be applied to it. FIG. 3 shows an example of a detailed cross-sectional view of the heater 120 and infrared detection element 110.

In FIG. 3, the infrared detection element 110 is adhesively-fixed onto the heater 120 in such a way that its surface on the other side of the sensor unit 111 is bonded to the heater 120 with an adhesive 181. The heater 120 is a heater in which a heating element 121 is disposed inside an insulating layer 122, and on its surface on the side of the infrared detection element 110, a thin film conductor 123 is formed by means of plating, sputtering or the like. When the heating element 121 is disposed inside the insulating layer 122, it is possible to secure the distance between the infrared detection element 110 and the heating element 121. In this case, it is possible to reduce the effect of the electrical noise which is generated by the heater 121 during its heating and is received by the infrared detection element 110, and accordingly to increase the infrared detection sensitivity. Further, by forming the thin film conductor 123 on the surface of the heater 120 on the side where the infrared detection element 110 is disposed, the heat generated by the heater 120 can be uniformly transferred to the infrared detection element 110, and accordingly the in-plane temperature distribution in the infrared detection element 110 can be uniform.

Bringing the description back to FIG. 2, in the present exemplary embodiment, as the heat-insulating member 130, a pillar-like glass member having a smaller cross-sectional area than that of the heater 120 is applied. The application of a pillar-like glass member makes it possible to suppress the outflow of heat from the heater 120 to the base 140.

Figure 4:
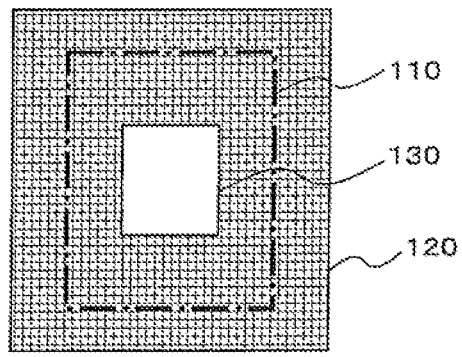
FIG. 4 is a plan view showing an example of an arrangement state of respective members of an infrared sensor package 100 according to the second exemplary embodiment of the present invention.

FIG. 4 shows an example of a positional relation between the heat-insulating member 130, heater 120 and the infrared detection element 110. In FIG. 4, because the cross-sectional area of the heat-insulating member 130 is smaller than that of the heater 120, a gap is formed between the heater 120 and the base 140. This gap separates the heater 120 and the base 140 thermally from each other. In this structure, the heater 120 can heat the infrared detection element 110 with high efficiency.

Further, in FIG. 4, it is desirable to dispose the heat-insulating member 130 in such a way that its center coincides with both the center of the heater 120 and that of the infrared detection element 110. When the centers of the heat-insulating member 130, infrared detection element 110 and heater 120 coincide with each other, in a process of connecting the external terminals of the infrared detection element 110 with that on the base 140 (that is, a wire-bonding process), it is possible to suppress the bending of the heater 120 which is caused by the heater 120's receiving a load only on its one side.

With respect to the heat-insulating member 130, the smaller the cross-sectional area is, the larger the heat insulation effect can be. However, if the cross-sectional area is too small, the heater 120 bends in the wire-bonding process, and its mechanical strength against vibrations and shocks declines. Therefore, it is desirable to determine a cross-sectional area of the heat-insulating member 130 on the basis of a result of a test on vibrations and shocks and the like Here, the materials applicable to the heat-insulating member 130 are borosilicate glass whose major ingredients are $Na_2O$, $B_2O_3$ and $SiO_2$, soda-lime glass whose major ingredients are $Na_2O$, CaO and $SiO_2$, and fused quartz made from $SiO_2$. Thermal conductivity is about 1 [W/mK] for these materials, which is two orders of magnitude lower than that for silicon and metals. Further, borosilicate glass is most preferable, because it has low thermal expansion coefficient, shows high endurance in heat-cycle and thermal-shock tests, and is inexpensive.

In FIG. 2, it is desirable to apply an electrically-conductive adhesive of high thermal conductivity to the adhesive 181, which bonds the infrared detection element 110 and the heater 120 to each other, so that the heat generated by the heater 120 is efficiently transmitted to the infrared detection element 110 and the infrared detection element 110 is thereby kept at a constant temperature. On the contrary, an electrically-insulating adhesive of low thermal conductivity is desirable as the adhesives 182 and 183, which respectively bond the thermal insulating member 130 to the heater 120 and the base 140, so that the amount of the heat generated by the heater 120 and transmitted to the base 140 is reduced.

The base 140 and the housing 150 form a space maintained as a vacuum by joined to each other in vacuum ambient. The vacuum space is formed, for example, by placing in a vacuum chamber the housing 150 and the base 140 to which the infrared detection element 110 or the like is adhesively-fixed in advance, and joining the base 140 and the housing 150 to each other after evacuating the vacuum chamber (to about 1 Pa, preferably to about $10^{-4}$ Pa).

The joining of the base 140 and the housing 150 can be performed by means of a melt-joining method wherein a filler metal (Sn, Pb, SnPb, SnAg, SnCu, SnAgCu, SnIn, SnZn, SnBi, SnZnBi, Bi, In and InAg) is formed in advance on the joining surfaces of the base 140 and the housing 150 and the filler metal is melted by heating. Other joining methods such as surface-activated bonding, thermal compression method, ultrasonic bonding and anodic bonding are also applicable.

Applicable to the base 140 are the wiring substrates using ceramic materials such as glass ceramics and alumina, or Si, as a base material, and the like. The linear expansion coefficients of these base materials are small (about 3-4 ppm) and only slightly different from that of the infrared detection element 110, so high long-term reliability is obtained on the infrared sensor package 100. Additionally, these base materials outgas less than resin materials, so deterioration of the vacuum degree of the package can be reduced.

In the housing 150, a through-hole is formed at a position facing the infrared detection element 110, and the infrared transmission filter 151 is fitted into the through-hole. As the material for the housing 150, it is desirable to apply an alloy material containing at least Ni, such as Kovar or Alloy 42. Because the linear expansion coefficients of these alloy materials are small (about 3-4 ppm), the infrared sensor package 100 of high long-term reliability can be realized. Additionally, because these alloy materials are magnetic materials, they provide a magnetic-shielding effect. Accordingly, electromagnetic interference from the other electronic devices located outside is suppressed, and stable operation can be realized thereby.

The materials applicable as the material for the infrared transmission filter 151 are, in addition to Si, Ge, ZnS, ZnSe, $Al_2O_3$, $SiO_2$ and the like, alkali halide materials such as LiF, NaCl, KBr, CsI, $CaF_2$, $BaF_2$, $MgF_2$, and alkaline-earth halide materials, and chalcogenide glasses whose primary ingredients are Ge, As, Se, Te, Sb and the like.

Further, external terminals of the infrared sensor package 100 not shown in the figure are formed on the surfaces of the infrared sensor package 100 including the side surfaces (the surfaces perpendicular to the base 140), the surface on the side of disposing the infrared transmission filter 151, and the surface on the side reverse to the infrared transmission filter 151.

As described above, in the infrared sensor package 100 according to the present exemplary embodiment, the heater 120 is supported by the heat-insulating member 130 having low thermal conductivity and smaller cross-sectional area than that of the heater 120. In this case, it is possible to sufficiently suppress the outflow of heat from the heater 120 to the base 140, and also to thermally separate the heater 120 and the base 140 from each other. The infrared sensor package 100 according to the present exemplary embodiment is a power-saving-type infrared sensor package wherein the infrared detection element-110 can be kept stably at a constant temperature, due to the fact that the heater 120 can heat the infrared detection element 110 with high efficiency.

Additionally, in this infrared sensor package 100, the plate-like heater 120 is adhesively-fixed onto the base 140 via the heat-insulating member 130, and further the infrared detection element 110 is adhesively-fixed onto the heater 120. In this case, there is no need for providing an additional independent substrate to support the infrared detection element 110, and both the number of members and that of process steps for assembly thus can be reduced, and the production cost thus can be lowered. Further, because the infrared detection element 110 and the heater 120 are composed of separate members, the distance between the infrared detection element 110 and the heater 120 can be secured and the grounds of the infrared detection element 110 and the heater 120 can be disposed separately. Accordingly, the effect of the electrical noise generated by the heater 120 on the infrared detection element 110 can be reduced, and higher infrared detection sensitivity thus can be realized.

In addition, in this infrared sensor package 100, thin film conductor 123 is formed on the surface, of the heater 120, on the side of disposing the infrared detection element 110. The thin film conductor 123 enables more uniform conduction of the heat generated by the heater 120 to the infrared detection element 110, and the dispersion of sensitivity thus becomes small. Accordingly, the performance of the infrared sensor package 100 can be improved.

Further, because the infrared detection element 110 and the heater 120 are bonded together by the use of the electrically-conductive adhesive 181 of high thermal conductivity, the heat generated by the heater can be conducted more efficiently to the infrared detection element 110, and accordingly, even when the environmental temperature changes, the temperature of the infrared detection element 110 can be controlled to be constant more quickly. On the other hand, because the heat-insulating member 130 is bonded to the heater 120 and the base 140 by the use of the electrically-insulating adhesive 182 of low thermal conductivity, the heat generated by the heater 120 cannot be easily conducted toward the base 140, and accordingly the infrared detection element 110 can be heated with higher efficiency. As a result, power consumption of the infrared sensor package 100 can be reduced further.

With respect to the present exemplary embodiment, an example in FIGS. 2 and 4 has been shown to have the heat-insulating member 130 whose cross-sectional area is smaller than that of the infrared detection element 110, but the cross-sectional area of the heat-insulating member 130 may be designed to be larger than that of the infrared detection element 110 while smaller than that of the heater 120. In this case, the force generated in a wire-bonding process can be accepted by both the heater 120 and the heat-insulating member 130. Accordingly, bending of the heater 120 in the wire-bonding process is suppressed, and the assembly yield is thus improved.

Although the base 140 and the housing 150 are joined together in a vacuum in the above-described exemplary embodiment, the joining is not limited to this way. For example, it is also possible to join the housing 150 and the base 140, on which the respective members are already mounted, to each other in the atmosphere, and subsequently join the infrared transmission filter 151 to the joined body in a vacuum. When the joining of the base 140 and the housing 150 is performed in the atmosphere, it is possible to melt a filler material by heating and join the two members continuously in a nitrogen atmosphere, using a reflow furnace or a hot plate. When the joining is performed in a nitrogen atmosphere, wettability of the filler material can be better, and its oxidation can be suppressed, and accordingly a highly reliable joining can be realized.

Additionally, it is also possible to join the base 140 and the housing 150 by laser welding. In laser welding, because the fusion joining is performed by locally heating the peripheries of the filler material for a short period of time, thermal damage to the infrared detection element 110 is low. When Sn—Ag solder (melting point of about 220° C., ° C.: degree Celsius) is used as the filler material, peak temperature of the reflow furnace or hot plate generally needs to be raised up to about 260° C., and accordingly degradation of characteristics and that of long-term reliability are considered to occur due to the thermal history.

Further, it is possible to dispose a getter material made from Zr system materials, Ti system materials or alloys containing them, in the infrared sensor package 100. When the getter material is activated just before or after vacuum-sealing the package, the gas outgassed within the package can be adsorbed to the getter material. Therefore, by the use of a getter material, the package can be sealed to be a high vacuum.

Third Exemplary Embodiment

Figure 5:
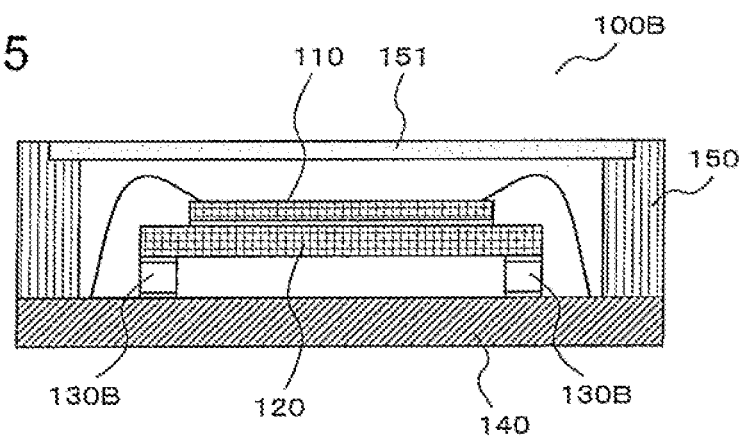
FIG. 5 is an example of a cross-sectional view of an infrared sensor package 100B according to the third exemplary embodiment of the present invention.
Figure 6:
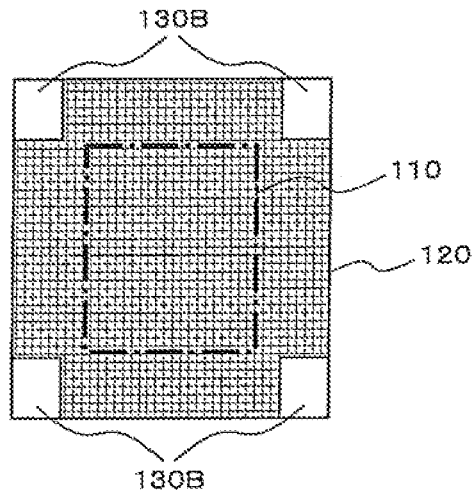
FIG. 6 is a plan view showing an example of an arrangement state of respective members of an infrared sensor package 100B according to the third exemplary embodiment of the present invention.

An infrared sensor package according to the third exemplary embodiment will be described. FIG. 5 shows an example of a cross-sectional view of an infrared sensor package according to the present exemplary embodiment. In the infrared sensor package 100B according to this exemplary embodiment shown in FIG. 5, in place of the heat-insulating member 130 of the infrared sensor package 100 of the second exemplary embodiment shown in FIG. 2, four heat-insulating members 130B are disposed at the four corners of the heater 120. In also the present exemplary embodiment, pillar-like glass members are applied as the four heat-insulating members 130B. FIG. 6 shows an example of a positional relation between the heat-insulating members 130B, infrared detection element 110 and heater 120, according to the present exemplary embodiment:

In FIG. 6, the four heat-insulating members 130B are disposed respectively at the four corners of the heater 120, which are outside the disposing area for the infrared detection element 110. Total cross-sectional area of the four heat-insulating members 130B is smaller than that of the heater 120.

When the four heat-insulating members 130B are disposed, in the surface of the heater 120, at the areas outside the disposing area for the infrared detection element 110, the heat generated by the heater 120 can be transmitted more efficiently to the infrared detection element 110, compared to when the heat-insulating member 130B is disposed underneath the infrared detection element 110. Further, when the four heat-insulating members 130B are disposed at the four corners of the heater 120, the structure is likely to accumulate the heat in the central region of the heater 120, and accordingly the infrared detection element 110 can be maintained more stably at a constant temperature.

In addition, when the heater 120 is supported by the four heat-insulating members 130B, the heater 120 can be supported stably in parallel with the base 140, and the infrared detection element 110 and the infrared transmission filter 151 are supported in parallel with each other. In this case, infrared radiation penetrating into the infrared sensor package 100B via the infrared transmission filter 151 can be efficiently received by the infrared detection element 110, and further, bending of the heater 120 in a wire-bonding process can be suppressed, which brings about an increase in the yield of the wire-bonding process. Accordingly, it is possible to provide the infrared sensor package 100B of high sensitivity and low production cost.

As described above, in the infrared sensor package 100B according to the present exemplary embodiment, the four heat-insulating members 130B having total cross-sectional area smaller than that of the heater 120 are disposed at the four corners of the heater 120, which are outside the disposing area for the infrared detection element 110. The rest of the structure is similar to that in the infrared sensor package 100 according to the second exemplary embodiment, and therefore, also the present embodiment is a power-saving-type infrared sensor package capable of stably maintaining the infrared detection element 110 at a constant temperature.

When the heat-insulating members 130B are disposed at the four corners of the heater 120, which are outside the disposing area for the infrared detection element 110, while materials cost is slightly higher, the yield of wire-bonding process can be improved as described above, compared to when only one heat-insulating member is disposed. In addition, the infrared detection element 110 can be maintained more stably at a constant temperature, and accordingly the infrared sensor package 100B can be of higher sensitivity.

What is required of the heat-insulating members 130B is to separate the heater 120 thermally from the base 140 while supporting the heater 120 stably. Any types of heat-insulating members 130B are applicable as long as they can support the heater 120 at least three points on the heater 120, which are outside the disposing area for the infrared detection element 110, where preferably the three or more points are separated from each other and are not located on the same straight line. Accordingly, the four heat-insulating members 130B can be substituted with one heat-insulating member formed in frame-like, grid-like or plate-like shape, two long heat-insulating members, a set of three or five or more heat-insulating members, or the like.

FIG. 7 shows an example of a cross-sectional view of an infrared sensor package 100C in which five heat-insulating members 130Ca-130Ce are disposed, and FIG. 8 shows an example of an arrangement state of the five heat-insulating members 130Ca-130Ce. In FIGS. 7 and 8, the heat-insulating member 130Ca is disposed at the central portion of the heater 120 (inside the disposing area of the infrared detection element 110), and the four heat-insulating members 130Cb-130Ce are disposed at the four corners of the heater 120 (outside the disposing area for the infrared detection element 110). When the heat-insulating members are disposed only at the four corners, because the heat generated by the heater 120 escapes to the base 140 via the periphery of the heater 120, temperature of the heater 120 becomes lower at the periphery than at the central portion, and temperature distribution of the heater 120 is thus degraded. On the contrary, when the heat-insulating member 130Ca is further disposed at the central portion of the heater 120, temperature difference between the periphery and the central portion, of the heater 120, can be reduced.

That is, by disposing heat-insulating members both inside and outside the disposing area for the infrared detection element 110, uniform in-plane temperature distribution of the infrared detection element 110 is obtained. As a result of obtaining uniform in-plane temperature distribution of the infrared detection element 110, it is possible to provide a high-performance infrared sensor package 100C of small sensitivity dispersion.

Modified Example of the Third Exemplary Embodiment

Figure 10:
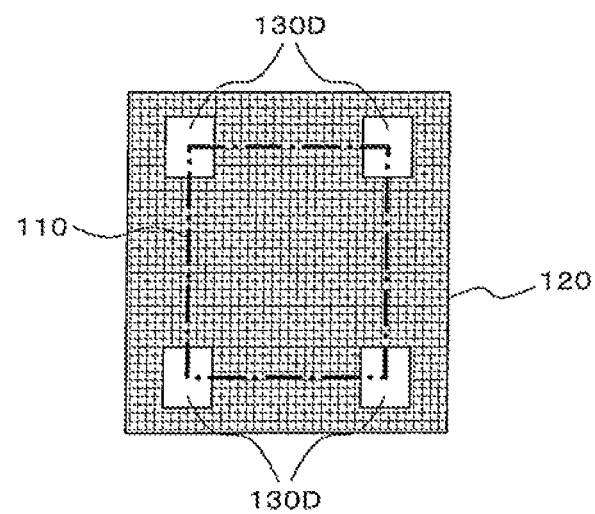
FIG. 10 is a plan view showing an example of an arrangement state of respective members of an infrared sensor package 100D according to a modified embodiment of the third exemplary embodiment of the present invention.

Next, description will be made on a modified example of the third exemplary embodiment. FIG. 9 shows an example of a cross-sectional view of an infrared sensor package 100D according to the present exemplary embodiment, and FIG. 10 shows an example of a positional relation between heat-insulating members 130D, the infrared detection element 110 and the heater 120. As recognized from FIGS. 9 and 10, an infrared sensor package 100D according to the present exemplary embodiment is different from the infrared sensor package 100B according to the third exemplary embodiment in that the four heat-insulating members 130D are disposed at the positions in the vicinities of the four corners of the heater 120, which are still outside the disposing area for the infrared detection element 110 but are more inside than the very corners of the heater 120. In this case, it is possible to obtain a constant value for the contact area between the heat-insulating members 130D and the heater 120 regardless of placement accuracy of the heat-insulating members 130D, and thus to reduce the production dispersion. For example, when the heat-insulating members 130D are fixed so as to protrude outside the heater 120, the contact area becomes smaller than a designed value, and accordingly the thermal conductance between the heater 120 and the base 140 changes, and accordingly the power consumption of the completed infrared sensor package 100D fluctuates.

Therefore, the infrared sensor package 100D according to the present exemplary embodiment is a power-saving-type infrared sensor package which can be produced with small dispersion and is capable of stably maintaining the infrared detection element 110 at a constant temperature.

Fourth Exemplary Embodiment

Figure 11:
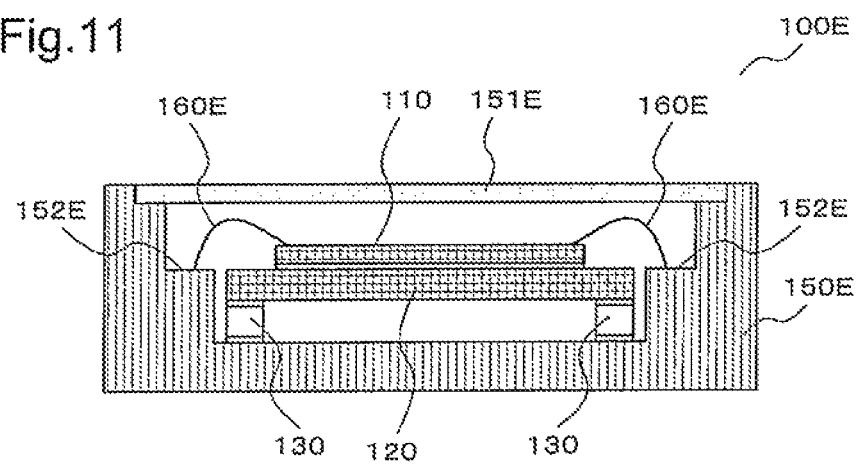
FIG. 11 is an example of a cross-sectional view of an infrared sensor package 100E according to the fourth exemplary embodiment of the present invention.

The fourth exemplary embodiment will be described. FIG. 11 shows an example of a cross-sectional view of an infrared sensor package 100E according to the present exemplary embodiment. As shown in FIG. 11, in the present exemplary embodiment, the infrared detection element 110 and the like are disposed inside a housing 150E, and an infrared transmission filter 151E is disposed in an opening provided in the upper section of the housing 150E.

Inside the housing 150E is formed a step 152E of a height comparable to that of the infrared detection element, and to the step 152E are connected wire leads 160E whose other ends are connected to the terminals on the infrared detection element 110. When the wire leads 160E are connected to the step 152E of a height comparable to that of the infrared detection element 110, the stress imposed by the wire leads 160E to the infrared detection element 110 can be reduced. Accordingly, high yield in a wire-bonding process is obtained, and long-term reliability of the infrared sensor package 100E can be improved.

In producing the infrared sensor package 100E according to the present exemplary embodiment, the housing 150E, which is provided with the infrared detection element 110 and the like, and the infrared transmission filter 151E are placed within a vacuum chamber, and then the vacuum chamber is evacuated. After evacuating the vacuum chamber, the housing 150E and the infrared transmission filter 151E are joined together so as to make the package in a vacuum inside. Because there is no need of a process to join a base and a housing together, the number of assembly processes can be reduced, and accordingly production cost of the infrared sensor package 100E can be lowered. Because of a smaller number of joining processes, thermal stress during the joining can be reduced, and accordingly long-term reliability of the infrared sensor package 100E can be improved.

Further, because the housing 150E is continuously fabricated from one material, thermal expansion coefficient is uniform all over it, and accordingly risk can be reduced with respect to formation of a crack and the like at a boundary between the bottom and side portions of the housing 150E due to thermal stress, compared to when a base and a housing are joined together.

The housing 150E according to the present exemplary embodiment can be applied to the infrared sensor packages 100, 100B, 100C and 100D respectively according to the above-described first to third exemplary embodiments.

The above-mentioned infrared sensor packages 100, 100B, 100C, 100D and 100E can be embedded into a module, electronic apparatus or the like in which the infrared sensor packages are electrically connected with a driving circuit. Provided with the above-mentioned infrared sensor packages 100, 100B, 100C, 100D and 100E, it is possible to start the infrared detection immediately after the power-on, and an electronic system for infrared detection can be easily designed without designing of a dedicated driving circuit at a system design side. Accordingly, it is possible to reduce the cost for system design of the electronic apparatus employing an infrared sensor package, and thus to provide a higher performance electronic apparatus at low price.

As above, the present invention has been described with reference to the above-mentioned respective exemplary embodiments, but the present invention is not limited to the above-mentioned exemplary embodiments. Various modifications may be made in configurations and details of the present invention within the range not departing from the spirit and scope of the present invention. Further, any embodiment obtained by properly combining with each other the respective configurations of the above-described exemplary embodiments, each partly or wholly, is also included in the present invention.

Here, Patent document 1 described in the background art causes a problem of such as high power-consumption, because of incomplete thermal design or the use of a power-consuming member, as described below.

Figure 12:
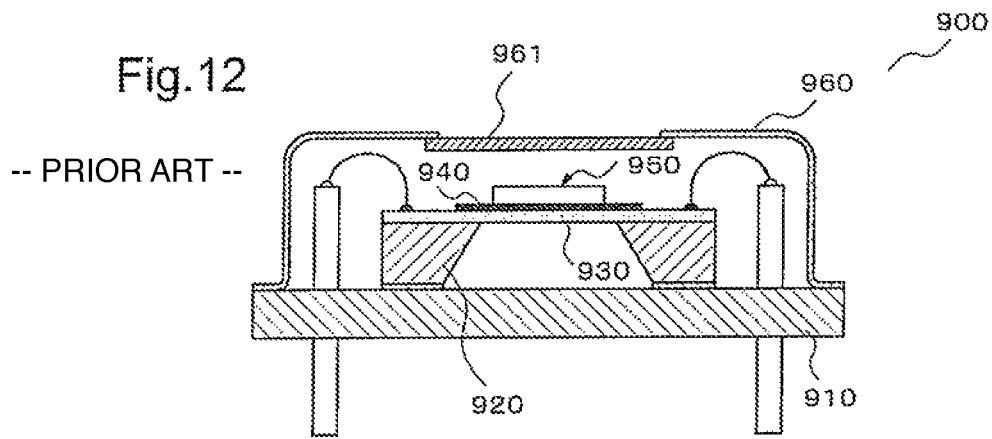
FIG. 12 is a cross-sectional view of an infrared sensor package 900 of Patent document 1.

In the infrared sensor package 900 of Patent document 1 shown in FIG. 12, a multilayer film with a thickness of about 0.7 μm is applied as the heat-insulating film 930. In this case, although thickness of the infrared sensor package 900 can be made small, it is difficult to sufficiently suppress the outflow of heat toward the substrate 920. Further, because the substrate 920 is formed out of silicon or the like, whose thermal conductivity is equivalent to that of metals, the heat which flowed out to the substrate 920 escapes easily to the base plate 910. Accordingly, in order to maintain the infrared detection element 950 at a constant temperature, much heat needs to be supplied by the heating element 940, and the power consumption thus increases.

In the infrared sensor package of Patent document 2 in the background art, the use of a Pelletier element makes it possible to stably keep the temperature of the infrared sensor element constant, but Pelletier element is highly power-consuming and expensive.

In contrast to Patent document 1 and Patent document 2, in an infrared sensor package according to the present invention, a heater member is supported by a heat-insulating member having a low thermal conductivity and a smaller cross-sectional area than that of the heater member. When the heater member is supported by the heat-insulating member having a low thermal conductivity, the outflow of heat from the heater member to a housing member via the heat-insulating member can be sufficiently suppressed. In addition, when the heater member is supported by the heat-insulating member having a smaller cross-sectional area than that of the heater member, a hollow space is formed between the heater member and the housing member, and the heater member and housing member thus can be thermally separated from each other.

Accordingly, it is possible to provide a power-saving-type infrared sensor package in which an infrared detection element can be maintained stably at a constant temperature.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

Further, it is the inventor's intention to retain all equivalents of the claimed invention even if the claims are amended during prosecution.

What is claimed is:

1. An infrared sensor package comprising:
   a housing member comprising an upper-surface section provided with a transmission member which transmits infrared radiation and a lower-surface section, wherein inner space of the housing member is vacuum-sealed;
   a plate-like heater member which is disposed within the inner space of said housing member and generates heat;
   an infrared detection element which is fixed onto a center area of said heater member and detects the infrared radiation which is transmitted by said transmission member; and
   a heat-insulating member which has a low thermal conductivity and a smaller cross-sectional area than that of said heater member, and supports said heater member while being fixed onto said lower-surface section,
   wherein said heater member is fastened on said lower-surface section of said housing member via said heat-insulating member, and said heat-insulating member is made of glass, and
   wherein said heat-insulating member is fastened onto edge areas of said lower-surface section, where said heat-insulating member stably supports said heater member.

2. The infrared sensor package according to claim 1, wherein
   said lower-surface section is formed as a member which is independent of said housing member.

3. The infrared sensor package according to claim 1, wherein said infrared detection element is adhesively-fixed onto said heater member by the use of electrically-conductive adhesive, and
   wherein said heat-insulating member is adhesively-fixed to said lower-surface section and to said heater member by the use of electrically-insulating adhesive.

4. The infrared sensor package according to claim 1, further comprising:
   a wire lead which electrically connects said infrared detecting element with said housing member;
   wherein the lower-surface section comprises a step for connecting the wire lead.

5. The infrared sensor package according to claim 1, wherein a thin film conductor is formed on the surface, of said heater member, to which said infrared detection element is fixed.

6. An electronic apparatus equipped with an infrared sensor package according to claim 1.

* * * * *